United States Patent
Fujii

(10) Patent No.: US 6,404,039 B1
(45) Date of Patent: Jun. 11, 2002

(54) SEMICONDUCTOR DEVICE WITH INTRINSIC BASE DIFFUSION LAYER, EXTRINSIC BASE DIFFUSION LAYER, AND COMMON BASE DIFFUSION

(75) Inventor: Hidenori Fujii, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/206,320

(22) Filed: Dec. 7, 1998

(30) Foreign Application Priority Data

Jun. 26, 1998 (JP) .......................................... 10-180249

(51) Int. Cl.[7] ...................... H01L 27/082; H01L 27/102; H01L 29/70; H01L 31/11
(52) U.S. Cl. ...................... 257/592; 257/556; 257/590; 148/DIG. 10
(58) Field of Search ................................ 257/142, 221, 257/511, 556, 590–592, 607, 655, 656; 148/DIG. 10; 438/325, 327, 337, 339

(56) References Cited

U.S. PATENT DOCUMENTS

| | | | |
|---|---|---|---|
| 4,546,536 A | * 10/1985 | Anatha et al. | 438/327 |
| 4,672,407 A | * 6/1987 | Nakagawa et al. | 257/142 |
| 4,972,239 A | * 11/1990 | Mihara | 257/142 |
| 4,985,741 A | * 1/1991 | Bauer et al. | 257/142 |
| 5,010,026 A | * 4/1991 | Gomi | 438/363 |
| 5,065,208 A | * 11/1991 | Shah et al. | 257/587 |
| 5,587,326 A | * 12/1996 | Takemura | 438/365 |
| 5,811,871 A | * 9/1998 | Nakashima | 257/565 |
| 5,917,222 A | * 6/1999 | Smayling et al. | 257/370 |

FOREIGN PATENT DOCUMENTS

| | | |
|---|---|---|
| JP | 5-47774 | 2/1993 |
| JP | 5-175204 | 7/1993 |

* cited by examiner

Primary Examiner—Carl Whitehead, Jr.
Assistant Examiner—Jamie L. Brophy
(74) Attorney, Agent, or Firm—McDermott, Will & Emery

(57) ABSTRACT

A bipolar transistor comprising an external base diffusion layer formed on the outer circumference of an intrinsic base diffusion layer is provided with the high withstand voltage and high reliability. A intrinsic base diffusion layer is formed on the substantially central portion of a semiconductor region surrounded by a separating insulation film on the major surface of a semiconductor substrate. An external base diffusion layer overlapping with the outer circumference of the intrinsic base diffusion layer, surrounding this intrinsic base diffusion layer, and reaching the separating insulation film is formed. Furthermore, common base diffusion layers overlapping with the intrinsic base diffusion layer, and overlapping with at least the inner circumference of the external base diffusion layer are formed. The depth of these common base diffusion layers is made deeper than the depth of the external base diffusion layer, but not exceeding the depth of the intrinsic base diffusion layer.

6 Claims, 6 Drawing Sheets external base forming impurity intrinsic base forming impurity emitter forming impurity

SEMICONDUCTOR DEVICE WITH INTRINSIC BASE DIFFUSION LAYER, EXTRINSIC BASE DIFFUSION LAYER, AND COMMON BASE DIFFUSION

BACKGROUND OF THE INVENTION

1. Field of the Invention

The present invention relates to the structure of a semiconductor device having a high withstand voltage and a high reliability, and more particularly, to a bipolar transistor, and a method of fabricating such a semiconductor device.

2. Description of Related Art

FIG. 5 is a sectional view showing a conventional npn transistor of a Double Polysilicon Self-Alignment (DPSA) structure.

In FIG. 5, reference numeral 1 denotes a semiconductor substrate (silicon substrate); 2 a semiconductor region (epitaxial layer); 3 separating insulation film (field oxide film); 4 an external base electrode; 5 a silicon oxide film; 6 an external base diffusion layer; 7 an intrinsic base diffusion layer; 8 a silicon oxide film; 9 an emitter electrode; 10 an emitter diffusion layer; 11 a silicon oxide film; 12 an external base contact electrode; 13 a collector contact electrode; 14 an emitter contact electrode; and 15 a protection film.

FIGS. 6A–6D are sectional views showing the steps of a method of fabricating a conventional npn transistor of a DPSA structure.

The method will be explained, as shown in FIG. 6A, an external base electrode 4 is first formed on the top surface of an npn transistor element region separated by a separating insulation film (field oxide film) 3 in a semiconductor region (epitaxial layer) 2 on a silicon semiconductor substrate 1, and an external base forming impurity is implanted.

Next, as shown in FIG. 6B, an external base diffusion layer 6 is formed by making an opening in a part of the intrinsic base region on the external base electrode 4 by photolithography, and heat-treating.

Next, as shown in FIG. 6C, an intrinsic base diffusion layer 7 is formed by implanting an intrinsic base forming impurity through the oxide film formed by heat treatment.

Next, as shown in FIG. 6D, after forming side walls 8, an emitter electrode 9 is formed, and an emitter forming impurity is implanted to form an emitter region 10.

Conventional npn transistors of a DPSA structure fabricated as described above have the following problems:
(1) In the region linking the intrinsic base diffusion layer 7 with the external base diffusion layer 6, an electric field is concentrated, a leakage current increases, and withstand voltage lowers.
(2) Since the intrinsic base diffusion layer 7 is formed by implanting an intrinsic base impurity into a delicately opened region, the impurity concentration profile at the edge of the opening has a large curvature, and leakage current increases, lowering withstand voltage.
(3) Since the external base diffusion layer 6 is formed by the diffusion from the external base electrode 4, the linkage at the edge of the separating insulation film (field oxide film) 3 becomes shallow, increasing leakage current and lowering withstand voltage.

SUMMARY OF THE INVENTION

The object of the present invention is to solve the above problems, and to provide a semiconductor device having a high withstand voltage, a high reliability, and a stable performance, in particular a bipolar transistor, especially an npn transistor, and a method of fabricating such a semiconductor device by
(1) relaxing the electric field in the region linking the intrinsic base diffusion layer with the external base diffusion layer;
(2) reducing the curvature of impurity concentration profile in the intrinsic base diffusion layer; and
(3) reducing leakage current at the end of the separating insulation film (field oxide film).

According to a first aspect of the present invention, there is provided a semiconductor device comprising an intrinsic base diffusion layer formed on the substantially central portion of a semiconductor region surrounded by a separating insulation film on the major surface of a semiconductor substrate; an external base diffusion layer overlapping with the outer circumference of said intrinsic base diffusion layer, surrounding said intrinsic base diffusion layer, and reaching the separating insulation film; and a common base diffusion layer formed in the semiconductor region, overlapping with said intrinsic base diffusion layer, overlapping with at least the inner circumference of said external base diffusion layer, and formed in a depth deeper than the depth of said external base diffusion layer but not exceeding the depth of said intrinsic base diffusion layer.

In the semiconductor device, the common base diffusion layer may be formed so as to overlap with the intrinsic base diffusion layer and the external base diffusion layer, and to reach the separating insulation film.

In the semiconductor device, the impurity concentration of the external base diffusion layer may be higher than the impurity concentration of the intrinsic base diffusion layer, and the impurity content of the common base diffusion layer may be lower than the impurity content of the intrinsic base diffusion layer.

In the semiconductor, the impurity concentration of the external base diffusion layer may be higher than the impurity concentration of the intrinsic base diffusion layer, and the impurity content of the common base diffusion layer may be lower than the impurity content of the intrinsic base diffusion layer.

According to a second aspect of the present invention, there is provided a method of fabricating a semiconductor device comprising the steps of forming, on the major surface of a semiconductor region of the first conductivity type formed on a semiconductor substrate, an external base diffusion layer of the second conductivity type in the outer circumference region other than the substantially central portion of a semiconductor region surrounded by a separating insulation film; forming an intrinsic base diffusion layer deeper than the external base diffusion layer on the substantially central portion of the semiconductor region surrounded by the separating insulation film; and implanting a common base impurity obliquely and rotationally into the substantially central portion of the semiconductor region, and forming common base diffusion layer of the second conductivity type having a depth deeper than the depth of the external base diffusion layer but not exceeding the depth of the intrinsic base diffusion layer.

According to a third aspect of the present invention, there is provided a method of fabricating a semiconductor device comprising the steps of forming, on the major surface of a semiconductor region of the first conductivity type formed on a semiconductor substrate, a common base diffusion layer of the second conductivity type by obliquely and rotationally implanting a common base impurity into a semiconductor region surrounded by a separating insulation film; forming an external base diffusion layer of the second conductivity type shallower than the common base diffusion layer in the outer circumference region other than the substantially central portion of the common base diffusion layer; and forming an intrinsic base diffusion layer deeper than the common base diffusion layer on the substantially central portion of the common base diffusion layer.

In the method of fabricating a semiconductor device, the impurity concentration of the external base diffusion layer may be made higher than the impurity concentration of the intrinsic base diffusion layer, and the impurity concentration of the common base diffusion layer may be made lower that the impurity concentration of the intrinsic base diffusion layer.

In the method of fabricating a semiconductor device, the impurity concentration of the external base diffusion layer may be made higher than the impurity concentration of the intrinsic base diffusion layer, and the impurity concentration of the common base diffusion layer may be made lower that the impurity concentration of the intrinsic base diffusion layer.

The above and other objects, effects, features and advantages of the present invention will become more apparent from the following description of the embodiments thereof taken in conjunction with the accompanying drawings.

DETAILED DESCRIPTION OF THE PREFERRED EMBODIMENTS

Figure 1:
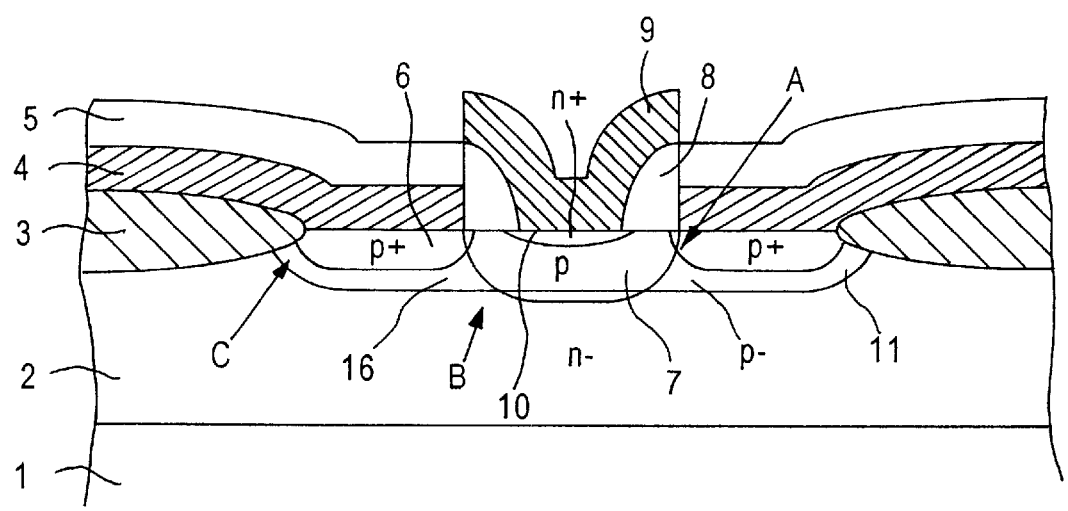
FIG. 1 is a sectional view showing an npn transistor of a DPSA structure as a semiconductor device according to embodiment 1 of the present invention.

The embodiments of the present invention will be described referring to drawings. In these drawings, the same reference numerals denote the same or corresponding parts.

EMBODIMENT 1

FIG. 1 is a sectional view showing an npn transistor of a DPSA structure as a semiconductor device according to embodiment 1 of the present invention.

In FIG. 1, reference numeral 1 denotes a semiconductor substrate (silicon substrate); 2 a semiconductor region which is an n⁻type silicon epitaxial layer grown on the semiconductor substrate 1; 3 a separating insulation film (field oxide film) formed on the major surface of the semiconductor region 2 for separating individual elements; 4 an external base electrode; 5 a silicon oxide film; 6 a p⁺ type external base diffusion layer; 7 a p type intrinsic base diffusion layer; 8 a side wall of a silicon oxide film; 9 an emitter electrode; 10 an n⁺ type emitter diffusion layer; and 16 a p⁻ type common base diffusion layer.

Thus, it is the feature of this embodiment 1 that the common base diffusion layer 16 is formed throughout the semiconductor region 2 surrounded by the separating insulation film 3.

As described above, in an npn transistor of this embodiment 1, a semiconductor region 2 of an n type (the first conductivity type) is formed on a semiconductor substrate 1, and the semiconductor region 2 is separated by the separating insulation film 3.

Also, an intrinsic base diffusion layer 7 of a p type (the second conductivity type) is formed in a substantially central portion of the semiconductor region 2 surrounded by the separating insulation film 3.

An external base diffusion layer 6 of a p⁺ type (the second conductivity type) is formed so as to overlap with the outer circumference of the intrinsic base diffusion layer 7, to surround the intrinsic base diffusion layer 7, and to reach the separating insulation film 3.

Furthermore, a common base diffusion layer 16 of a p⁻ type (the second conductivity type) is formed in the semiconductor region 2 surrounded by the separating insulation film 3 so as to overlap with the intrinsic base diffusion layer 7 and the external base diffusion layer 6, and to reach the separating insulation film 3. The depth of the common base diffusion layer 16 is deeper than the depth of the external base diffusion layer 6, but does not exceed the depth of the intrinsic base diffusion layer 7.

An emitter region 10 of an n⁺ type (the first conductivity type) is formed on the surface of the intrinsic base diffusion layer 7, and a semiconductor region 2 of an n⁻ type (the first conductivity type) becomes a collector region.

The npn transistor thus formed has the following advantages:

(1) The p⁻ type common base diffusion layer 16 relaxes the electric field in the region linking the intrinsic base diffusion layer 7 with the external base diffusion layer 6 in portion A of FIG. 1.

(2) The p⁻ type common base diffusion layer 16 reduces the curvature of impurity concentration profile in the intrinsic base diffusion layer 7 at the edge of the opening in portion B of FIG. 1.

(3) Since an impurity of the p⁻ type common base diffusion layer 16 is implanted deeply at the edge portion of the field oxide film 3 in portion C of FIG. 1, the withstand voltage is improved.

Through the above advantages, the improvement of withstand voltage, reliability, and stable performance of the npn transistor are achieved.

EMBODIMENT 2

FIGS. 2A–2E are diagrams showing a method of fabricating a semiconductor device according to embodiment 2 of the present invention. This can be applied as the method of fabricating the semiconductor device described for embodiment 1. The method will be described below.

Figure 2A:
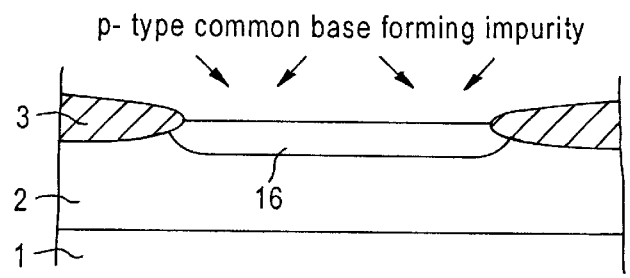
FIGS. 2A to 2E are diagrams showing a method of fabricating a semiconductor device according to embodiment 2 of the present invention.

First, as shown in FIG. 2A, an n⁻ type semiconductor region (epitaxial layer) 2 is formed on a semiconductor substrate 1. The surface of the n⁻ type semiconductor region 2 is partitioned and separated by a separating insulation film (field oxide film) 3 to form a semiconductor region in which elements are formed.

A p⁻ type common base forming impurity (such as B and $BF_2$) is rotationally implanted at 20–80 keV and ions of $1 \times 10^{11}$–$1 \times 10^{13}/cm^2$ (1E11–1E13) into the semiconductor region 2 surrounded by the separating insulation film 3.

Figure 2B:
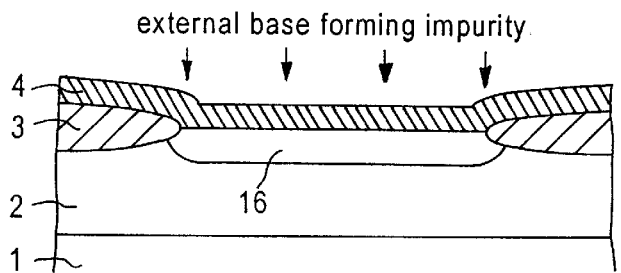

Next, as shown in FIG. 2B, an external base electrode 4 of a thickness of 1,000–5,000 Å is deposited from polysilicon and the like by Chemical Vapor Deposition (CVD) on the semiconductor region 2 surrounded by the separating insulation film 3, and an external base forming impurity (such as B and $BF_2$) is implanted at 10–50 keV and ions of $1 \times 10^{14} – 1 \times 10^{16}/cm^2$ (1E14–1E16).

Figure 2C:
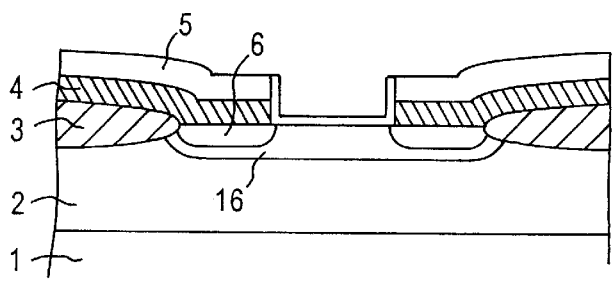

Next, as shown in FIG. 2C, a silicon oxide film 5 of a thickness of 1,000–4,000 Å is deposited by CVD on the external base electrode 4, and after making an opening for an intrinsic base portion with photolithography, heat treatment is performed at 800–900° C. for about 1 hour to form an external base diffusion layer 6.

At this time, the depth of the external base diffusion layer 6 is made shallower than the depth of the common base diffusion layer 16.

Also, at this time, a thermal oxide film is formed on the inner surface of the opening.

Figure 2D:
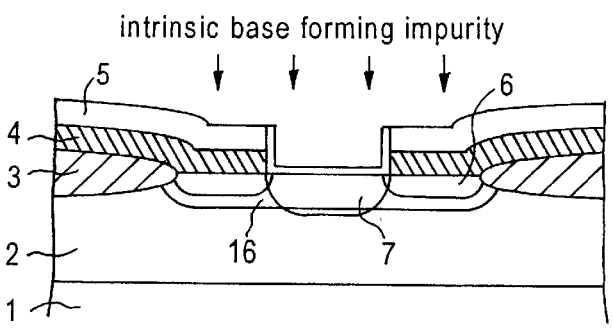

Next, as shown in FIG. 2D, an intrinsic base forming impurity is implanted through the oxide film formed by heat treatment to form a p type intrinsic base diffusion layer 7.

At this time, the depth of the intrinsic base diffusion layer 7 is the same as or deeper than the depth of the $p^-$ type common base diffusion layer 16.

Figure 2E:
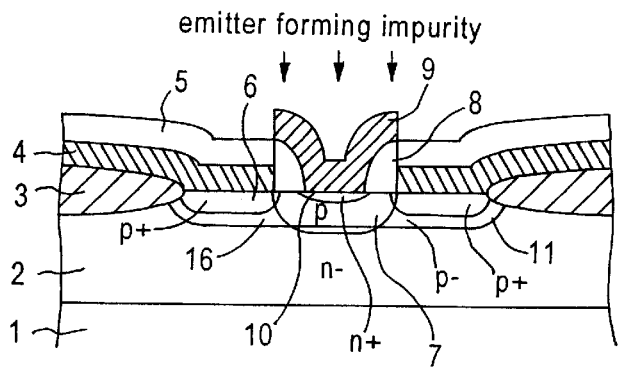

Next, as shown in FIG. 2E, an oxide film for electrically separating the external base electrode 4 from the emitter electrode 9 is deposited, and etched back to form the side wall 8 as well as the opening for the emitter diffusion region.

Next, an emitter electrode 9 is formed from polysilicon and the like, an impurity for forming an emitter diffusion layer is implanted, and this impurity is diffused from the emitter electrode 9 to form an emitter region 10.

Next, the emitter electrode 9 is patterned by photolithography. Although the subsequent steps are not illustrated, an oxide film is deposited thereon, a contact is formed, wiring is made, and a protective film is formed according to the method of fabricating ordinary semiconductor devices.

An npn transistor of the structure as described in embodiment 1 (FIG. 1) can be fabricated by the method described above.

According to the fabricating method described above, the depth of the common base diffusion layer 16 can be adequately controlled so as to be deeper than the depth of the external base diffusion layer 6 but not deeper than the intrinsic base diffusion layer 7.

By this method, an npn transistor having the advantages as described in embodiment 1 (FIG. 1) can be fabricated.

EMBODIMENT 3

Figure 3:
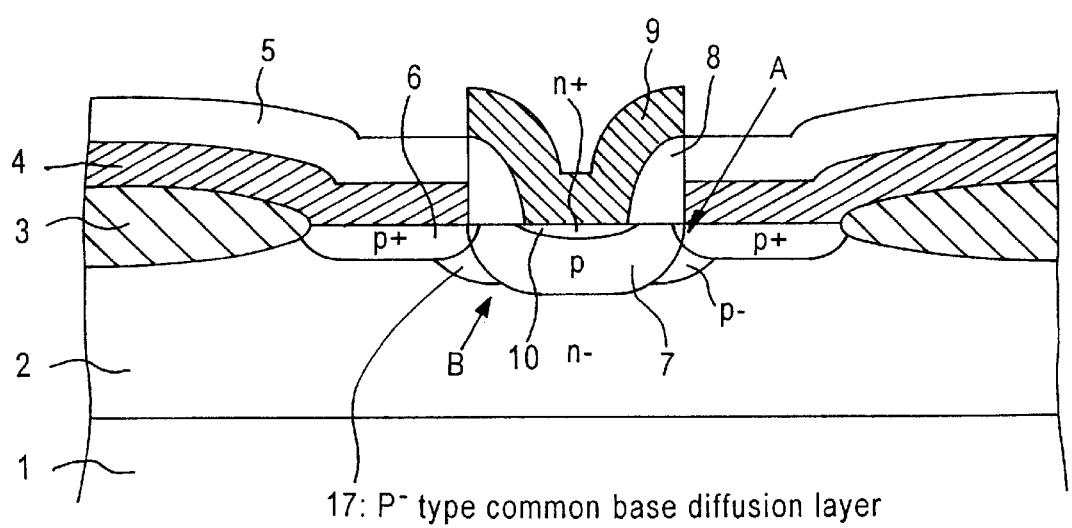
FIG. 3 is a sectional view showing an npn transistor of a DPSA structure according to embodiment 3 of the present invention.

FIG. 3 is a sectional view showing an npn transistor of a DPSA structure according to embodiment 3 of the present invention.

In FIG. 3, reference numeral 17 denotes a $p^-$ type common base diffusion layer, and the description of other numerals is omitted because they denote the same component parts as in FIG. 1.

As shown in FIG. 3, in the npn transistor of this embodiment 3, a semiconductor region 2 of an n type (the first conductivity type) is formed on a semiconductor substrate 1, and the semiconductor region 2 is separated by a separating insulation film 3.

A intrinsic base diffusion layer 7 of a p type (the second conductivity type) is formed in the substantially central portion of the semiconductor region 2 surrounded by the separating insulation film 3.

An external base diffusion layer 6 of a $p^+$ type (the second conductivity type) is formed so as to overlap with the outer circumference of the intrinsic base diffusion layer 7, to surround the intrinsic base diffusion layer 7, and to reach the separating insulation film 3.

Furthermore, a common base diffusion layer 17 of a $p^-$ type (the second conductivity type) is formed in the semiconductor region 2 surrounded by the separating insulation film 3 so as to overlap with the intrinsic base diffusion layer 7 and the inner circumference of the external base diffusion layer 6. The depth of the common base diffusion layer 17 is deeper than the depth of the external base diffusion layer 6, but does not exceed the depth of the intrinsic base diffusion layer 7.

An emitter region 10 of an $n^+$ type (the first conductivity type) is formed on the surface of the intrinsic base diffusion layer 7, and a semiconductor region 2 of an $n^-$ type (the first conductivity type) becomes a collector region.

This embodiment 3 is characterized in that the common base diffusion layer 17 is formed so as to overlap with the intrinsic base diffusion layer 7 and to the middle of the surrounding external base diffusion layer 6.

The npn transistor thus formed has the following advantages:

(1) The $p^-$ type common base diffusion layer 17 relaxes the electric field in the region linking the intrinsic base diffusion layer 7 with the external base diffusion layer 6 in portion A of FIG. 3.

(2) The $p^-$type common base diffusion layer 17 reduces the curvature of the impurity concentration profile in the intrinsic base diffusion layer 7 at the edge of the opening in portion B of FIG. 3.

Through the above advantages, the improvement of withstand voltage, reliability, and stable performance of the npn transistor are achieved.

EMBODIMENT 4

FIGS. 4A–4D are diagrams showing a method of fabricating a semiconductor device according to embodiment 4 of the present invention. This can be applied as the method of fabricating the semiconductor device described for Embodiment 3. The method will be described below.

Figure 4A:
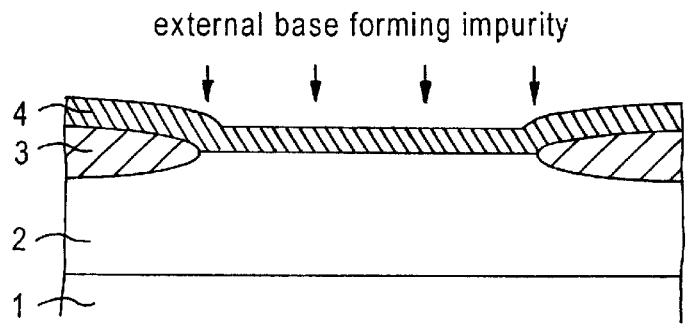
FIGS. 4A to 4D are diagrams showing a method of fabricating a semiconductor device according to embodiment 4 of the present invention.

First, as shown in FIG. 4A, an $n^-$ type semiconductor region (epitaxial layer) 2 is formed on a semiconductor substrate (silicon substrate) 1. The surface of the n type semiconductor region 2 is partitioned and separated by a separating insulation film (field oxide film) 3 to form a semiconductor region in which elements are formed.

Next, an external base electrode 4 of a thickness of 1,000–5,000 Å is deposited from polysilicon and the like by CVD on the semiconductor region 2 surrounded by the separating insulation film 3, and an external base forming impurity (such as B and $BF_2$) is implanted at 10–50 keV and ions of $1 \times 10^{14} – 1 \times 10^{16}/cm^2$ (1E14–1E16).

Figure 4B:
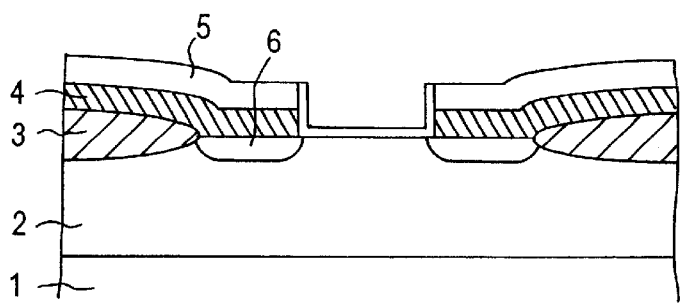

Next, as shown in FIG. 4B, an oxide film 5 of a thickness of 1,000–4,000 Å is deposited by CVD on the external base electrode 4, and after making an opening for an intrinsic base portion with photolithography, heat treatment is performed at 800–900° C. for about 1 hour to form an external base diffusion layer 6.

At this time, a thermal oxide film is formed on the inner surface of the opening.

Figure 4C:
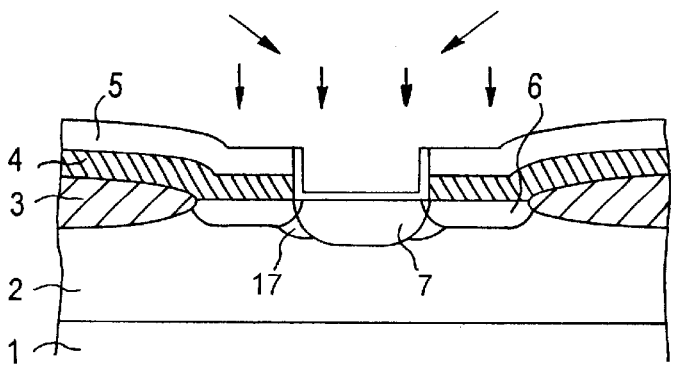

Next, as shown in FIG. 4C, an intrinsic base forming impurity is implanted through the oxide film formed by heat treatment to form an intrinsic base diffusion layer 7.

In addition to the implantation of the intrinsic base forming impurity, a p⁻ type common base forming impurity (such as B and $BF_2$) is obliquely and rotationally (3–60 degrees) implanted at 10–60 keV and ions of $1\times10^{11}$–$1\times10^{13}$/cm² (1E11–1E13).

At this time, the depth of the p⁻ type common base diffusion layer 17 is made deeper than the depth of the external base diffusion layer 6, and is made equal to or shallower than the intrinsic base diffusion layer 7.

Figure 4D:
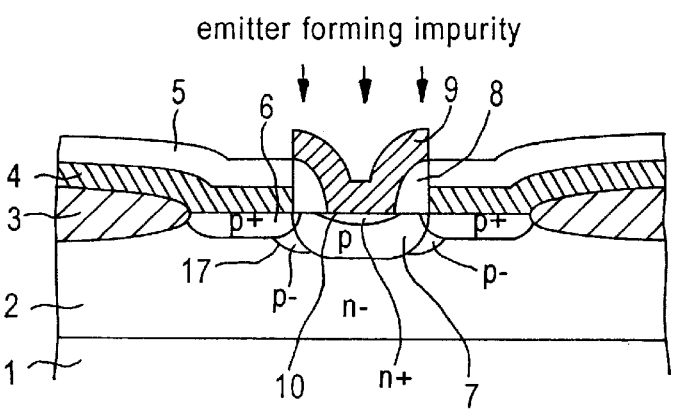
Figure 5:
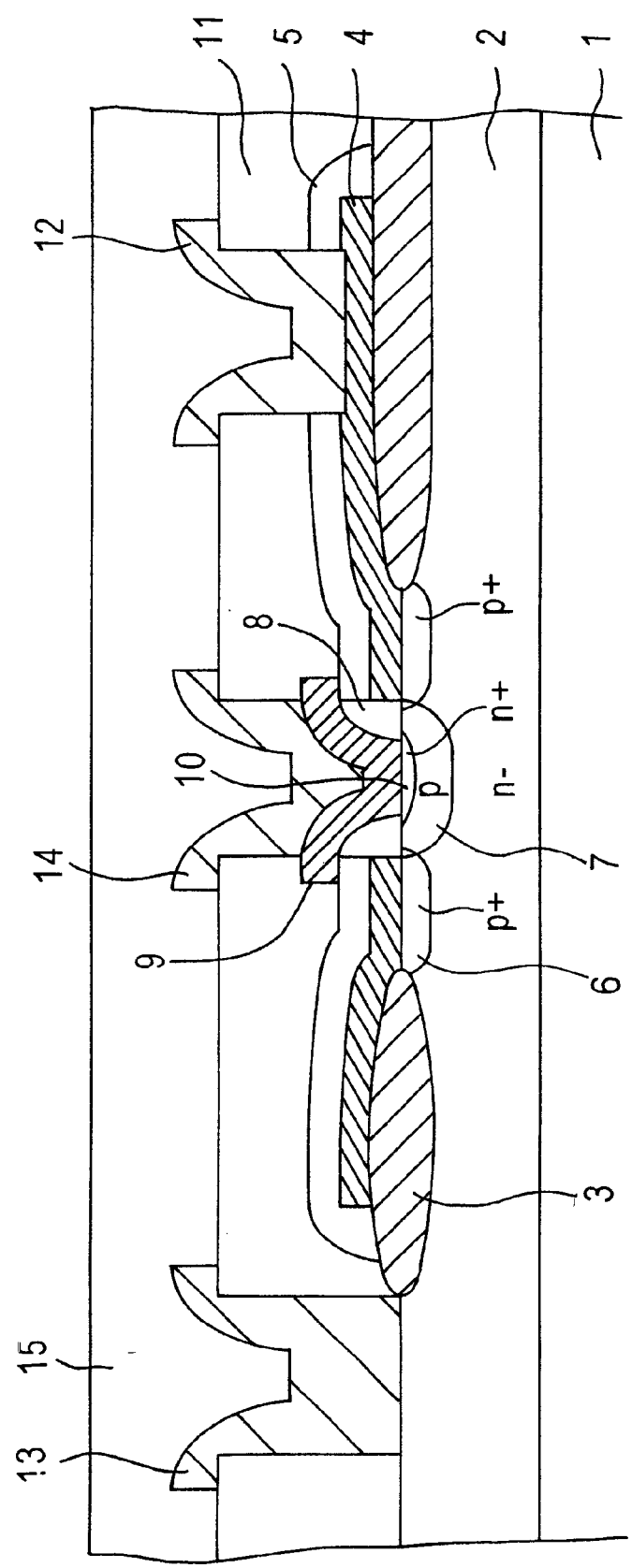
FIG. 5 is a sectional view showing a conventional npn transistor of a DPSA structure.
Figure 6A:
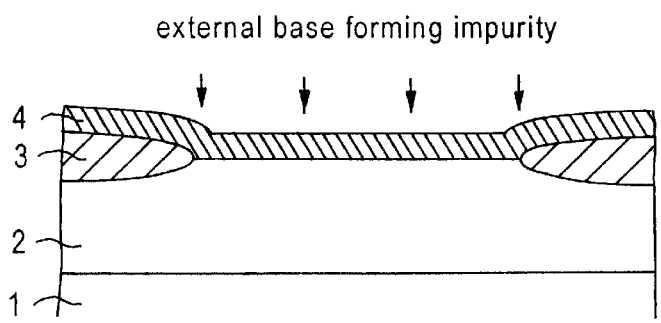
FIGS. 6A to 6D are sectional views showing the steps of a method of fabricating a conventional npn transistor of a DPSA structure.
Figure 6B:
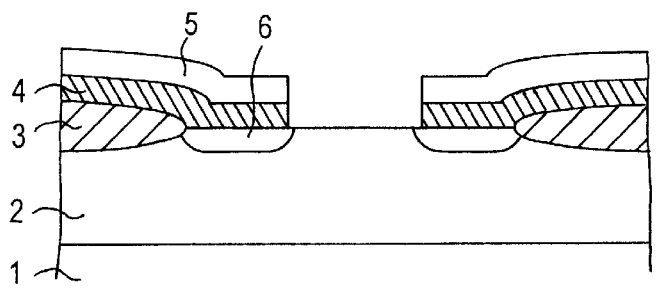
Figure 6C:
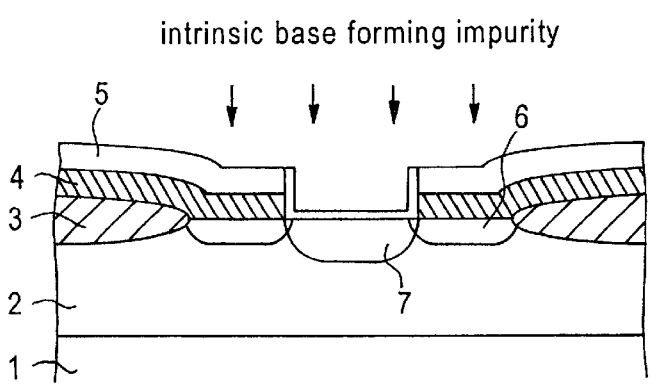
Figure 6D:
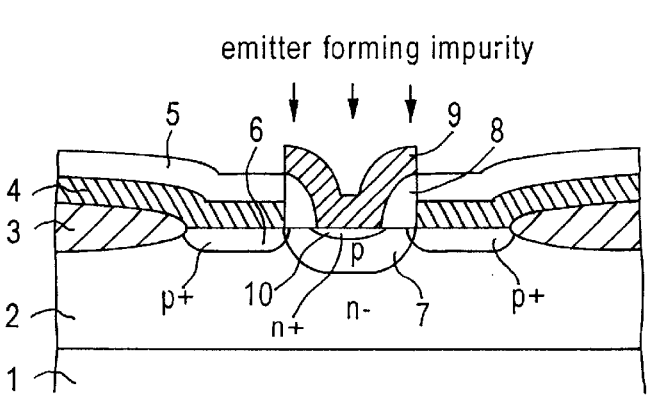

Next, as shown in FIG. 4D, an oxide film for electrically separating the external base electrode 4 from the emitter electrode 9 is deposited, and etched back to form the side wall 8 as well as the opening for the emitter diffusion region.

Next, an emitter electrode 9 is formed from polysilicon and the like, an impurity for forming an emitter diffusion layer is implanted, and this impurity is diffused from the emitter electrode 9 to form an emitter region 10.

Next, the emitter electrode 9 is patterned by photolithography. Although the subsequent steps are not illustrated, an oxide film is deposited thereon, a contact is formed, wiring is made, and a protective film is formed according to the method of fabricating ordinary semiconductor devices.

An npn transistor of the structure as described in embodiment 3 (FIG. 3) can be fabricated by the method described above.

According to the fabricating method described above, the depth of the common base diffusion layer 17 can be adequately controlled so as to be deeper than the depth of the external base diffusion layer 6 but not deeper than the intrinsic base diffusion layer 7.

By this method, an npn transistor having the advantages as described in embodiment 3 can be fabricated.

Since the present invention is constituted as described above, it has the following advantages.

In a semiconductor device having an external base diffusion layer continuously formed on the outer circumference of an intrinsic base diffusion layer according to the present invention, (1) the electric field in the region linking the intrinsic base diffusion layer with the external base diffusion layer is relaxed, and (2) the curvature of impurity concentration profile in the intrinsic base diffusion layer is reduced. Therefore, a high withstand voltage, a high reliability, and the stable performance of the semiconductor device, in particular the bipolar transistor, can be achieved.

Also in a semiconductor device having an external base diffusion layer continuously formed on the outer circumference of an intrinsic base diffusion layer according to the present invention, (3) leakage current at the edge of the separating insulation film (field oxide film), the outer circumference of which comes in contact with the external base diffusion layer, is reduced. Therefore, a high withstand voltage, a high reliability, and the stable performance of the semiconductor device, in particular the bipolar transistor, can be achieved.

The present invention has been described in detail with respect to various embodiments, and it will now be apparent from the foregoing to those skilled in the art that changes and modifications may be made without departing from the invention in its broader aspects, and it is the invention, therefore, in the appended claims to cover all such changes and modifications as fall within the true spirit of the invention.

The entire disclosure of Japanese Patent Application No. 10-180249 filed on Jun. 26, 1998 including specification, claims, drawings and summary are incorporated herein by reference in its entirety.

What is claimed is:

1. A bipolar structure semiconductor device, comprising:
   an intrinsic base diffusion layer formed on the substantially central portion of a semiconductor region surrounded by a separating insulation film on the major surface of a semiconductor substrate;
   an external base diffusion layer overlapping with the outer circumference of said intrinsic base diffusion layer, surrounding said intrinsic base diffusion layer, and reaching the separating insulation film; and
   a common base diffusion layer formed in the semiconductor region, overlapping with said intrinsic base diffusion layer, the outer circumference thereof overlapping with the inner circumference of said external base diffusion layer, and formed in a depth deeper than the depth of said external base diffusion layer, but not exceeding the depth of said intrinsic base diffusion layer.

2. The bipolar structure semiconductor device according to claim 1, wherein an impurity concentration of said external base diffusion layer is higher than an impurity concentration of said intrinsic base diffusion layer, and an impurity concentration of said common base diffusion layer is lower than an impurity concentration of said intrinsic base diffusion layer.

3. A bipolar structure semiconductor device, comprising:
   an intrinsic base diffusion layer formed on the substantially central portion of a semiconductor region surrounded by a separating insulation film on the major surface of a semiconductor substrate;
   an external base diffusion layer overlapping with the outer circumference of said intrinsic base diffusion layer, surrounding said intrinsic base diffusion layer, and reaching the separating insulation film; and
   a common base diffusion layer formed in the semiconductor region, overlapping with said intrinsic base diffusion layer, overlapping with at least the inner circumference of said external base diffusion layer, and formed in a depth deeper than the depth of said external base diffusion layer, but not exceeding the depth of said intrinsic base diffusion layer;
      wherein said common base diffusion layer is formed so as to overlap with said intrinsic base diffusion layer and said external base diffusion layer, and to reach the separating insulation film; and
      an impurity concentration of said external base diffusion layer is higher than an impurity concentration of said intrinsic base diffusion layer, and an impurity concentration of said common base diffusion layer is lower than an impurity concentration of said intrinsic base diffusion layer.

4. A semiconductor device, comprising:
   an intrinsic base diffusion layer of a second conductivity type formed on the substantially central portion of a semiconductor region of a first conductivity type surrounded by a separating insulation film on the major surface of a semiconductor substrate;
   an external base diffusion layer of a second conductivity type overlapping with the outer circumference of said intrinsic base diffusion layer, surrounding said intrinsic base diffusion layer, and reaching the separating insulation film; and
   a common base diffusion layer of a second conductivity type formed in the semiconductor region, overlapping with said intrinsic base diffusion layer, the outer circumference thereof overlapping with the inner circumference of said external base diffusion layer, and formed in a depth deeper than the depth of said external base diffusion layer, but not exceeding the depth of said intrinsic base diffusion layer.

5. The semiconductor device according to claim 4, wherein an impurity concentration of said external base diffusion layer is higher than an impurity concentration of said intrinsic base diffusion layer, and an impurity concentration of said common base diffusion layer is lower than an impurity concentration of said intrinsic base diffusion layer.

6. A semiconductor device, comprising:

an intrinsic base diffusion layer of a second conductivity type formed on the substantially central portion of a semiconductor region of a first conductivity type surrounded by a separating insulation film on the major surface of a semiconductor substrate;

an external base diffusion layer of a second conductivity type overlapping with the outer circumference of said intrinsic base diffusion layer, surrounding said intrinsic base diffusion layer, and reaching the separating insulation film; and a common base diffusion layer of a second conductivity type formed in the semiconductor region, overlapping with said intrinsic base diffusion layer, overlapping with at least the inner circumference of said external base diffusion layer, and formed in a depth deeper than the depth of said external base diffusion layer, but not exceeding the depth of said intrinsic base diffusion layer;

wherein said common base diffusion layer is formed so as to overlap with said intrinsic base diffusion layer and said external base diffusion layer, and to reach the separating insulation film; and an impurity concentration of said external base diffusion layer is higher than an impurity concentration of said intrinsic base diffusion layer, and an impurity concentration of said common base diffusion layer is lower than an impurity concentration of said intrinsic base diffusion layer.

* * * * *

UNITED STATES PATENT AND TRADEMARK OFFICE
CERTIFICATE OF CORRECTION

PATENT NO. : 6,404,039 B1
DATED : June 11, 2002
INVENTOR(S) : Hidenori Fujii

It is certified that error appears in the above-identified patent and that said Letters Patent is hereby corrected as shown below:

<u>Title page,</u>
Item [54], Title should appear as follows:
-- SEMICONDUCTOR DEVICE WITH INTRINSIC BASE DIFFUSION LAYER, EXTRINSIC BASE DIFFUSION LAYER, AND COMMON BASE DIFFUSION LAYER --

Signed and Sealed this

Eighteenth Day of February, 2003

JAMES E. ROGAN
*Director of the United States Patent and Trademark Office*